LINEAR VOLTAGE TO CURRENT CONVERTER

Filed Oct. 6, 1966

INVENTOR
S. J. BROLIN
BY John P. McDonnell
ATTORNEY 3,493,784

LINEAR VOLTAGE TO CURRENT CONVERTER

Stephen J. Brolin, Bronx, N.Y., assignor to Bell Telephone Laboratories, Incorporated, Murray Hill, N.J., a corporation of New York Filed Oct. 6, 1966, Ser. No. 584,843
Int. Cl. H03f *1/08, 1/34*
U.S. Cl. 307—260 8 Claims

ABSTRACT OF THE DISCLOSURE

A linear active device is used in a corrective feedback loop around an amplifier with one net phase inversion to provide linear voltage to current conversion with a high impedance output that is independent of the offset and output electrode bias voltages of the amplifier. With this arrangement, complete circuit flexibility as to number of outputs, waveform shaping, etc., may be additionally and easily provided.

This invention relates to voltage to current conversion circuits and, more particularly, to voltage to current conversion circuits with a high degree of linearity.

In communications systems, it is often desired to amplify A.C. input signals, which may vary from very small to relatively larger magnitudes, to produce a D.C. output signal that is linearly proportional to the A.C. input signal. Straightforward amplification and rectification of the input signals introduces nonlinearities in the output signal due to the dynamic response limitations of the amplifier which, since it must have a large gain for input signals of a relatively small magnitude, is overdriven into cut-off or saturation for input signals having a larger magnitude. A network employed for this linear signal conversion purpose must, therefore, have a gain which varies in accordance with the magnitude of the input signal so as to prevent overdriving the amplifier.

Serial resistor-diode networks connected from the output to input of a high gain amplifier in the manner illustrated in FIG. 1 have been employed to effectively vary the gain of the amplifier in accordance with the magnitude of the input signal. In this configuration, the current fed-back from the output of the amplifier to the input is limited to the magnitude of the input current, as discussed in detail hereinafter. Since the magnitude of the output current of the amplifier is thus constrained to a value proportional to the magnitude of the input signal, the gain of the amplifier is effectively controlled by the magnitude of the input signal.

In this prior art arrangement, however, only a voltage output (across the resistor) can be provided and the offset voltage (i.e., the D.C. voltage applied to the input terminal of an amplifier to produce a desired quiescent voltage at the output terminal) determines or shifts the D.C. level of the output signal. Moreover, the characteristics and output electrode biasing potential of the amplifier limit the swing of the output signals. These voltage output, D.C. level, and output signal swing restrictions limit the applicability of these circuits.

It is therefore, an object of this invention to provide a linear voltage input to current output conversion circuit.

It is a further object of this invention to provide a conversion circuit wherein the output signal is unaffected by the offset voltage and biasing potentials of the amplifier.

In one embodiment of the present invention, the amplifier feedback loop comprises a diode parallel connected back-to-back with the input electrodes of a linear active device such as, for example, the base-emitter electrodes of a transistor. The diode and the active device are conductive in opposite directions to insure a continuous feedback loop. The output electrode of the active device is connected to the load and, due to the isolation and self-correction effectively provided by the active device, the D.C. output current delivered to the load is unaffected by the offset and biasing voltage limitations of the prior art. An appropriately designed gain-frequency shaping network, e.g., a low-pass filter, may be serially connected with the input electrodes of the active device to obtain a desired waveform output.

In a second embodiment of the invention, the input electrodes of two linear active devices, which again may be transistors, are connected around an amplifier to be conductive in opposite directions as a continuous feedback loop. The output electrodes of these active devices may be connected to individual loads, or the output of one may be connected to an inverting stage which is, in turn, connected to the single load to produce a full-wave output current through the single load. Moreover, by simply connecting a wave-shaping or similar network in place of the inverting stage, variations in the waveform of the output signal may be readily obtained. An appropriately designed gain-frequency shaping network, such as a low-pass filter, may also be serially connected with the input electrodes of the active device to obtain a desired waveform output.

Other objects and features of the present invention will readily become apparent upon consideration of the following detailed description when taken in connection with the accompanying drawing in which FIG. 1 is a circuit found in the prior art which is useful in illustrating the advantages of the present invention;

Figure 2:
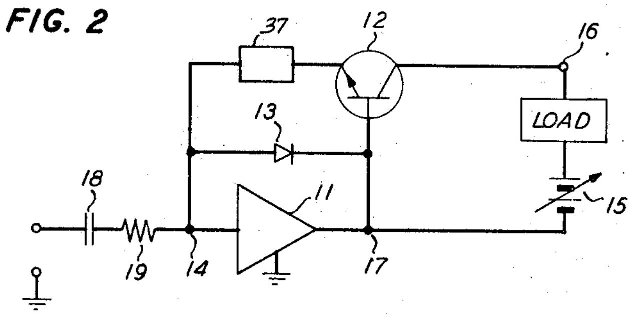
FIG. 2 illustrates a first simple embodiment of the present invention.

As can be seen from FIG. 2 of the drawing, the network input is connected through a D.C. blocking capacitor 18 and resistor 19 to the input 14 of amplifier 11. Amplifier 11 may be any of a host of commercially available operational amplifiers, the only requirements being that of negative phase inversion (odd number of stages), reasonable gain, and high input impedance. One such amplifier which may be employed, for example, is the Motorola MC 1531 Integrated Operational Amplifier. The base electrode of npn transistor 12 is connected to the output of amplifier 11 while the emitter electrode of transistor 12 may be connected either directly to the input to amplifier 11 or to an appropriately designed gain-frequency shaping network 37 which is in turn connected to the input of amplifier 11. Diode 13 is connected across the base and emitter electrodes of transistor 12 and is poled to conduct in a direction opposite to the forward conductivity current flow through the base-emitter junction of transistor 12. As noted heretofore, transistor 12 is connected in a common base configuration with the D.C. source of collector (output electrode) bias 15 and the load serially connected with its base and collector electrodes.

Figure 1:
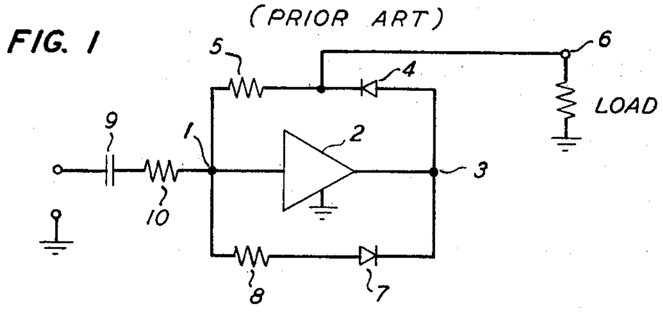
(PRIOR ART) FIG. 1

The present invention is best understood by first discussing the prior art circuit of FIG. 1. Amplifier 2 in FIG. 1 normally has a high voltage gain and one net phase inversion. A small input signal applied through D.C. blocking capacitor 9 and resistor 10 to input terminal 1 will therefore result in a voltage output at the output 3 of the amplifier which is sufficiently large to initiate forward condition through either diode 4 or 7. Thus, when the input potential at the input terminal is positive, the potential at the output 3 will be negative, and diode 4 will be back-biased. In this condition, no current flows through resistor 5 and the voltage at output terminal 6 is zero. When the potential at the input terminal 1 is negative, however, the potential at the output terminal 3 is positive, diode 4 is forward biased, and a positive voltage appears at the output terminal 6. Since for this condition diode 7 is back-biased and only a negligible amount of the input current flows through the high input impedance of the amplifier, all of the input current must flow through resistor 5 when diode 4 is conducting. The output voltage at terminal 6 will therefore be proportional to the input current.

The prior art circuit of FIG. 1 is limited in three respects; first, the offset voltage of the amplifier acts as a diode bias and shifts the output voltage level of the network; second, the swing of the output signal is limited by the amplifier characteristics and the D.C. output electrode biasing potential of the amplifier; and, finally, the circuit can provide only a voltage output. (The offset voltage may, as noted heretofore, be defined as the D.C. voltage applied to the input terminal of an amplifier to produce a desired quiescent voltage at the output terminal.)

The present invention, one embodiment of which is illustrated in FIG. 2, overcomes these disadvantages by the addition of transistor 12 and the elimination of diode 4 and resistors 5 and 8. For positive input voltages, the base-emitter path of transistor 12 will be back-biased by the phase inverted output 17 of amplifier 11 and diode 13 will be forward biased into conduction to complete the feedback loop and provide a path for the input current in the manner discussed in connection with FIG. 1. In addition, the forward potential drop across this diode will both hold transistor 12 in cutoff and, more importantly, protect the base-emitter junction of transistor 12 from the high inverse voltage between input terminal 14 and output terminal 17.

A negative input voltage will appear at the output 17 of amplifier 11 as a positive voltage which biases the base-emitter and collector-emitter paths of transistor 12 into conduction. Since for negative input voltages diode 13 will be back-biased and only a negligible amount of input current flows through the high input impedance of the amplifier 11, all of the input current must flow from the emitter electrode of transistor 12 when this transistor is conductive. The current gain of transistor 12, which as noted heretofore is connected in a common base configuration, is close to unity. The output current at terminal 16 for negative input voltages is therefore substantially that of the input current and, of course, linearly related to the voltage at the input to the network. The gain of the amplifier 11 and the action of the feedback loop eliminates any nonlinearities introduced by the threshold voltages of the diode or transistor. The output at the collector electrode of transistor 12 resembles the output of a current generator and, since variations in base-collector voltage vary the operation of the transistor only slightly, the load connected to the collector electrode is effectively isolated from the remaining portion of the conversion circuit. Because of the isolation advantage, the voltage 15 may be varied to obtain a desired output D.C. signal swing without altering the operation of the feedback loop or the amplifier.

The advantages of the present invention when compared to the prior art circuit of FIG. 1 can now be easily seen. Initially, and most obviously, the present invention provides a current output that resembles the output of a current generator whereas the prior art circuit can only provide a voltage output. Secondly, the action of the transistor in the feedback loop of the circuit of FIG. 2 is self-correcting and independent of the offset voltage in that the output or load current is a function of the input current. In the prior are circuit of FIG. 1, on the other hand, the voltage across the load 6 will be the sum of the voltages across the resistor 5 and the offset voltage of amplifier 11. When examined in this manner, the level shifting effect of the offset voltage on the output voltage should be apparent.

Finally, the isolation provided by the connection of the load to the collector electrode of transistor 12 eliminates the restriction placed on the magnitude of the output swing by the D.C. output electrode biasing voltage of the amplifier 11. As noted heretofore, relatively large variations in the base-collector bias voltage supplied by the battery 15 will have only a relatively negligible effect on the base-emitter circuit of transistor 12. The voltage of battery 15 may therefore be adjusted to provide a desired output signal swing without effecting the operation of the circuit of FIG. 2 discussed heretofore. The prior art FIG. 1 circuit swing is, of course, restricted by the D.C. biasing voltage at the output electrode of the amplifier.

The output at the collector electrode of transistor 12 resembles that of a current generator, i.e., has a high output impedance. Although a tarnsistor is used in the embodiment of the invention illustrated in FIG. 2, any linear active device having at least three electrodes could be substituted for this transistor. For example, a pentode tube could be substituted in place of transistor 12 by connecting and appropriately biasing the control grid to the output 17 of amplifier 11, the cathode to the input 10 of amplifier 11, and the plate to the output terminal 16. The remaining grids of the pentode would be connected to appropriate D.C. biasing potentials. Variations in the output waveform may be obtained by connecting an appropriately designed gain-frequency shaping network 37, e.g., a low-pass filter, between the emitter electrode of transistor 12 and the input 14 to the amplifier 11 as indicated by the dotted box in FIG. 2. An amplifier may also be inserted in place of the box 37 to provide additional gain.

Figure 3:
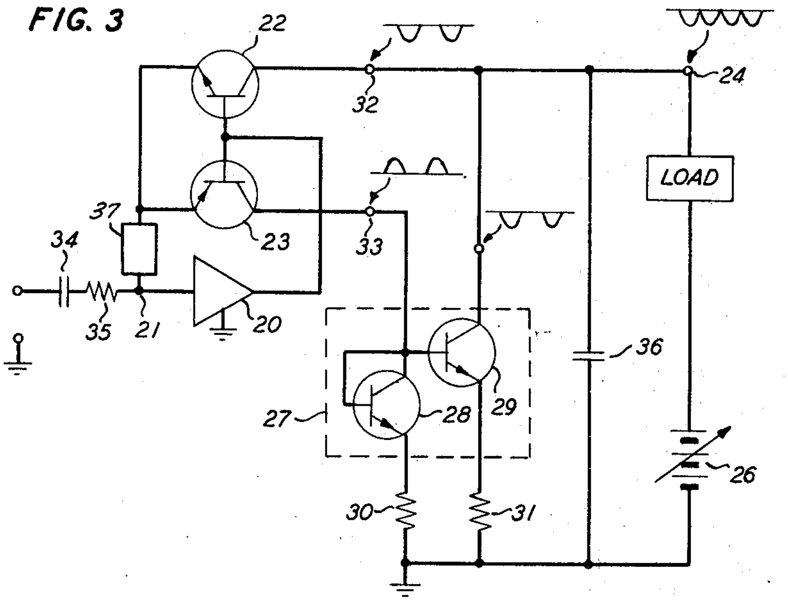
FIG. 3 illustrates a second full-wave embodiment of the present invention.

A full-wave, second embodiment of the present invention is shown in FIG. 3. In the circuit of FIG. 3, the network input is connected through D.C. blocking capacitor 34 and resistor 35 to the input 21 of amplifier 20. The emitter electrodes of transistors 22 and 23, both of which are connected in a common base configuration, are connected to the input 21 to amplifier 20, while the common base electrodes of the transistors are connected to the output of amplifier 20. The collector electrode of the transistor 22 is connected to the output terminal 24. The load and D.C. bias battery 26 are serially connected from terminal 24 to ground. The dotted box 27 comprises two matched transistors 28 and 29. These transistors would, in a preferred embodiment, be monolithic transistors which, since they were made on the same layers of materials, would be very closely matched. Any pair of matched transistors can be used, of course, but since monolithic transistors are substantially less expensive and closely matched, they are preferred.

The base and collector electrodes of transistor 28 and the base electrode of transistor 29 are connected to output terminal 33 and the collector electrode of transistor 23. The collector electrode of transistor 29 is connected to the output terminal 24. Resistors 30 and 31, which are preferably of equal magnitude, are connected from the emitter electrodes of transistors 28 and 29, respectively, to ground.

The operation of the circuit of FIG. 3 is substantially the same as that of FIG. 2 except for the use of transistor 23 and the elimination of diode 13 of FIG. 2. In the manner discussed in connection with FIG. 2, the base-emitter path of transistor 23 will be forward biased and conductive for positive inputs, and the base-emitter path of transistor 22 will be forward biased and conductive for negative inputs. For a sine-wave input, for example, the alternate positive half-sinusoid inputs will appear at the collector electrode of transistor 23 while the alternate negative half-sinusoid inputs will appear at the collector electrode of transistor 22. Separate loads may be connected to terminals 32 and 33 or where full-wave conversion and rectification is desired, a pair of matched transistors such as monolithic transistors 28 and 29 may be employed as illustrated in FIG. 3.

In the configuration of FIG. 3, the positive half-sinusoids appearing at the collector electrode of transistor 23 drives transistors 28 and 29, the latter of which convert the current input at a relatively low impedance level to a current output at a high impedance level. The current through the collector-emitter path of transistor 28 and the base-emitter path of transistor 29 will be equal. The positive half-sinusoids driving transistor 29 are inverted by this transistor and a series of alternate negative half-sinusoids, corresponding in phase to the positive half-sinusoids and alternate in time to the negative half-sinusoids at the collector electrode of transistor 22, appear at the collector electrode of transistor 29. The sum of the currents at the output terminals 24 therefore is a rectified full-wave output which may be easily filtered.

The versatility provided by the dual circuit of FIG. 3 should be noted. The circuit provides three distinct output signals: the signal at the collector electrode of transistor 22, the signal at the collector electrode of transistor 23, and the sum or difference of these signals. In addition, the wave-shapes of the signals may be readily varied by connecting the collector electrode of either transistor 22 or 23 to a current sink, an A.C. ground, or similar network depending on the waveform output desired. In addition, variations in the output waveform may also be obtained by connecting an appropriately designed gain-frequency shaping network 37, e.g., a low-pass filter, between the emitter electrodes of transistors 22 and 23 and the input 21 to the amplifier 20 as indicated by the dotted box in FIG. 2. An amplifier may also be inserted in place of the box 37 to provide additional gain. In the manner discussed in connection with transistor 12 of the circuit of FIG. 2, transistors 22 and 23 may be linear active devices such as, for example, pentodes. The dual transistor configuration of FIG. 3 has the additional advantage of reducing the drive output required from amplifier 20.

In summary, the use of a linear active device in a corrective feedback loop around an amplifier with one net phase inversion provides linear voltage to current conversion with a high impedance output that is independent of the offset and output electrode bias voltages of the amplifier. In addition, complete circuit flexibility as to number of outputs, waveform shaping, etc. may be additionally, and easily provided.

The above-described arrangement is illustrative of the application of the principles of the invention. Other embodiments may be devised by those skilled in the art without departing from the spirit and scope thereof.

What is claimed is:

1. A linear voltage to current converter comprising an amplifier, a linear active device having first, second, and control electrodes, a load connected to said first electrode of said active device, a diode connected across the second and control electrodes of said active device and poled to conduct in a direction opposite to the direction of current flow through the second and control electrodes of said active device, and means connecting the second electrode of said active device to the input to said amplifier and the control electrode of said active device to the output of said amplifier to deliver an output current to said load which is linearly proportional to the input voltage of said amplifier and unaffected by the offset voltage of said amplifier.

2. A linear voltage to current converter in accordance with claim 1 wherein said linear active device is a transistor having a first collector electrode, a second emitter electrode, and a base control electrode.

3. A linear voltage to current converter in accordance with claim 2 wherein a gain-frequency shaping network is connected between said emitter electrode and the input to said amplifier to shape the waveform of the current through said load.

4. A linear voltage to current converter comprising an amplifier, first and second linear active devices each having first, second, and control electrodes, first and second loads respectively connected to the first electrodes of each of said first and second linear active devices, and means connecting the second electrodes of said first and second linear active devices to the input of said amplifier and the control electrodes of said first and second linear active devices to the output of said amplifier so that said devices conduct in opposite directions to deliver output currents to said first and second loads which are linearly proportional to the input voltage to said amplifier and unaffected by the offset voltage of said amplifier.

5. A linear voltage to current converter in accordance with claim 4 wherein said first and second linear active devices are first and second transistors of opposite conductivity types, each having a first collector electrode, a second emitter electrode, and a control base electrode.

6. A linear voltage to current converter in accordance with claim 4 wherein said second load comprises a wave-shaping network.

7. A linear voltage to current converter in accordance with claim 5 wherein a gain-frequency shaping network is connected between the emitter electrode of said transistors and the input of said amplifier.

8. A linear voltage to curent converter in accordance with claim 4 wherein said second load comprises a pair of matched transistors and first and second resistors of equal magnitude, means connecting an indivdual one of said resistors between the emitter electrode of each of said transistors and a common reference potential, means connecting the base and collector electrodes of one of said transistors to the base electrode of the other transistor and the first electrode of said second linear active device, and means connecting the collector electrode of said other transistor to said first load, whereby the current output of said first active device and at least a portion of the inverter current output of said second active device flows through said first load.

References Cited

UNITED STATES PATENTS

| | | | |
|---|---|---|---|
| 3,196,291 | 7/1965 | Woodward | 328—26 |
| 3,329,836 | 7/1967 | Pearlman | 307—313 |
| 3,369,128 | 2/1968 | Pearlman | 307—229 |
| 3,384,830 | 5/1968 | Deniet | 307—229 |
| 3,411,066 | 11/1968 | Bravenec | 321—8 |

DONALD D. FORRER, Primary Examiner

D. M. CARTER, Assistant Examiner

U.S. Cl. X.R.

330—28